United States Patent [19]
Nishimichi

[11] Patent Number: 5,287,025
[45] Date of Patent: Feb. 15, 1994

[54] TIMING CONTROL CIRCUIT

[75] Inventor: Yoshito Nishimichi, Higashiosaka, Japan

[73] Assignee: Matsushita Electric Industrial Co., Ltd., Kadoma, Japan

[21] Appl. No.: 871,983

[22] Filed: Apr. 22, 1992

[30] Foreign Application Priority Data

Apr. 23, 1991 [JP] Japan .................................. 3-092013
Nov. 13, 1991 [JP] Japan .................................. 3-296924

[51] Int. Cl.$^5$ .......................................... H03K 5/135
[52] U.S. Cl. ................................. 307/603; 307/269; 307/602; 328/55; 328/63
[58] Field of Search .................. 307/602, 603; 328/55; 377/76

[56] References Cited

U.S. PATENT DOCUMENTS

| | | | |
|---|---|---|---|
| 4,443,765 | 4/1984 | Findeisen et al. | 307/602 |
| 4,618,788 | 10/1986 | Backes et al. | 307/602 |
| 4,796,095 | 1/1989 | Shimada | 328/55 |
| 5,049,766 | 9/1991 | Van Diest et al. | 328/55 |
| 5,111,086 | 5/1992 | Back | 307/603 |

OTHER PUBLICATIONS

"The 68040 32-b Monolithic Processor", Anderson et al., IEEE Journal of Solid-State Circuits, vol. 25, No. 5, Oct. 1990, pp. 1178-1180.

Primary Examiner—John S. Heyman
Attorney, Agent, or Firm—Wenderoth, Lind & Ponack

[57] ABSTRACT

A timing control circuit to be used for a phase locked loop (PLL) wherein, a plurality of delay circuit elements capable of controlling the delay connected in series are used as a signal delay circuit, delay values of all the delay circuit elements can be changed at the same time with the delay control signals of the respective delay circuit elements being commonly connected, and the delay control signal is controlled so as to select the desired delay with the combination of a selecting circuit, a bi-directional shift register circuit, a phase detecting circuit, a shift control circuit, a delay control circuit so as to realize the wide range of timing control, thereby to provide a function of adjusting the delay of a signal delay circuit for effecting a timing control operation.

5 Claims, 12 Drawing Sheets

TIMING CONTROL CIRCUIT

BACKGROUND OF THE INVENTION

The present invention generally relates to an integrated circuit apparatus having timing control circuits for delaying inputted digital signals by a constant time under a certain control so as to output them, and more particularly, even among them, to a timing control circuit to be used when the delay of the signals is controlled dynamically in a phase locked loop (PLL).

In a microprocessor and its peripheral system having an operation frequency exceeding 40 MHz, a synchronous interface with a high bus-band-width is demanded so as to obtain a high performance. Especially when the bus clock becomes 25 ns or lower, the skew existence between an internal clock and a bus clock of the function device cannot be neglected with respect to the bus clock despite the synchronous operation of the respective function devices (especially integrated circuits) with the bus clock. The higher speed (especially retention of setup time and hold time) of the access to the memory subsystem becomes difficult to effect.

Influences upon the setup time and the hold time by the skew existence between the internal clock and the bus clock of the above described function device will be described in one example with reference to the drawings.

FIG. 11 shows the relationship between the reading data from the memory subsystem synchronized with the bus clock and the internal clock of the function device. Here all the timings are prescribed with respect to the rising edge of the bus clock. Assume that the setup time of the reading data with respect to the rising edge of the bus clock is d1, and the hold time is d2. Further, the reading data are adapted to be sampled with a rising edge of the internal clock.

When the internal clock is delayed by time d with respect to the bus clock as shown in FIG. 11 (a), the hold time with respect to the rising edge of the internal clock becomes (d2−d). When the value is deviated from the specification of the functional device, the reading data cannot be sampled correctly any more in the function device. Such a situation is caused in a function device for generating, operating the internal clock from the bus clock. Generally, the minimum value of the hold time is often prescribed to be 0Ns. The hold time with respect to the bus clock becomes necessary to be at least 3 through 5 ns or so if d=3 through 5 ns although it is the amount of the load of the internal clock.

When the bus clock is delayed by time d with respect to the internal clock as shown in FIG. 11 (b), the setup time with respect to the rising edge of the internal clock becomes d1−d. When the value is deviated from the specification of the functional device, the reading data cannot be sampled correctly any more in the function device. Such a situation is caused in a function device for generating the bus clock from the internal clock so as to feed it. Generally the maximum value of the setup time is desired to be 3 ns or so. The setup time with respect to the bus clock becomes necessary to be at least 5 through 10 ns or so if d=5 through 10 ns although it depends upon the size of the bus load.

A margin considering the time difference d of the internal clock with respect to the bus clock is necessary to be provided with respect to the setup time d1 and the hold time d2 of the reading data with respect to the rising edge of the bus clock. This makes it difficult to have the higher speed of the access to the memory subsystem.

In order to obtain the high performance with these clock skews being made as small as possible, the phase locked loop (PLL) for controlling the phase is used with the use of the timing control circuit with an eye to making the skew between the internal clock of the function device and the bus clock as small as possible.

One conventional example of the phase locked loop (PLL) for controlling the phase with the use of the timing control circuit will be described hereinafter with reference to the drawings.

FIG. 12 is one conventional embodiment of the phase locked loop (PLL) for controlling the phase with the use of the timing control circuit. In FIG. 12, the signal delaying circuit 30 is composed of the series connection of a plurality of delay circuit elements with the clock signals 32 being made as input signals, signals with clock signals 32 being delayed are outputted as delay clock signals 34 from the output of the respective delay circuit elements. One of these delay clock signals 34 is selected by a selecting circuit 40 and is given to an internal clock generating circuit 110. A bus control circuit 112 generates an internal bus clock 114 by an internal clock 48 to be caused. A bus clock 116 is a clock having twice a period of the clock signals 32, is inputted to the phase detecting circuit 120 together with the internal bus clock 114 so as to produce the phase control signal 122 corresponding to the phase difference. The phase control signal 122 is inputted to a shift control circuit 124, the shift control circuit 124 controls the shift operation of a bi-directional shift register circuit 50 and the bi-directional shift register circuit 50 controls the selecting circuit 40.

A signal delay circuit 30, a selecting circuit 40, a bi-directional shift register circuit 50, a bus control circuit 112, an internal clock generating circuit 110, a phase detecting circuit 120, a shift control circuit 124 compose a phase locked loop (PLL). The phase detecting circuit 120 generates a phase control signal 122 corresponding to the phase difference between the internal bus clock 114 and the bus clock 116. The shift control circuit 124 shifts the set bit of the bi-directional shift register circuit 50 with the use of the phase control signal 122. The set bit exists in the only register within the bi-directional shift register circuit 50 with the others being reset bits. The set bit and the reset bit become control signals of the selecting circuit 40 so as to select the delay clock signal 34 of the signal delay circuit 30 corresponding to the set bit. The delay 10 clock signal 34 of the signal delay circuit 30 corresponding to the reset bit is not selected. The delay of the clock signal 32 is selected so that the phase difference of the internal bus clock 114 with respect to the bus clock 116 may become minimum. For example, when the internal bus clock 114 is delayed with respect to the bus clock 116, a delay clock signal 34 which is small in delay is selected with the use of the selecting circuit 40 and the bi-directional shift register circuit 50 so as to advance the internal bus clock 114. When the internal bus clock 114 advances with respect to the bus clock 116, the delay clock signal 34 large in the delay is selected with the use of the selecting circuit 40 and the bi-directional shift register circuit 50 so as to delay the internal bus clock 114.

The controlling operation is effected so that the phase of the internal bus clock 114 may be brought into conformity with respect to the bus clock 116 so as to minimum the skew between the clocks. One realizing example of such phase locked loop (PLL) is described in "The 68040 32-b Monolithic Processor (IEEE Journal of Solid-State Circuits, Vol. 25, No. 5, Oct. 1990, p1178-1180)."

But the above described construction has such problems as described hereinafter.

(1) As the delay of the respective delay circuit elements for constituting the signal delay circuit 30 is constant, it is difficult to change the range and accuracy of the phase control. In order to solve the problems, it is easily supposed that the delay of the delay circuit element for constituting the signal delay circuit 30 has only to be varied so as to change the phase range and accuracy by the situation of the phase control. Unless a means of precisely grasping the situation of the phase control is realized, the range and the accuracy of the phase control cannot be change easily.

(2) There is no means to know whether or not the delay necessary to the phase synchronous operation is in the delay to be controlled by the signal delay circuit 30.

(3) Two types of clock signals (bus clock and clock having frequencies twice as many as it) are used so as to simplify the phase synchronization. When only the bus clock is used (when the frequency of the bus clock itself is sufficiently high, the clock having frequency twice as many as it is hard to use), the phase of the bus clock is necessary to be delayed by 360° (180° when the logic has been inverted by a logic inverting circuit). To cope with the wide frequency range, the delay becomes insufficient in the signal delay circuit 30 only, thus making it impossible to effect a controlling operation.

SUMMARY OF THE INVENTION

Accordingly, the present invention has been developed with a view to substantially eliminating the above discussed drawbacks inherent in the prior art and has for its essential object to provide an improved timing control circuit.

Another important object of the present invention is to provide an improved timing control circuit which is adapted to generate delay control signals, warning signals, delay line selection control signals by the detection of the position of the set bit within bi-directional shift register circuit 50, make it possible to effect a flexible delay controlling operation by the adjustment of the delay of the respective delay circuit elements for constituting the signal delay circuit 30, the delaying of the signal by a given time prior to the signal delay circuit.

In accomplishing these and other objects of the present invention, a first feature of the invention resides in a timing control circuit where comprises a delay circuit connected in series by n pieces (n≧2) of delay circuit elements each having a plurality of delay values for outputting given signals under delaying by a constant time, a selecting circuit for outputting upon selecting one of the outputs from each of the delay circuit elements, a phase control circuit for deciding outputs of the delay circuit elements to be selected so as to coincide the output signals of the selecting circuit with the signals to be given to the delay circuit, and a delay control circuit for controlling the delay value of the delay circuit element itself, whereby, when the phase control circuit has judged that the delay amount of the whole delay circuits is insufficient at the phase synchronization, the delay control circuit is going to change the delay values of the delay circuit elements so as to change the delay control ranges of the delay circuits. With the above arrangement of the first feature, the delay control circuit is adapted to control the signal delay circuit connected seriously a plurality of delay circuit elements for controlling the delay values, and the selection circuit for outputting selectively on of the outputs of the respective delay circuit elements on the basis of the phase difference information of the phase control circuit, whereby, by changing the delay values of the delay circuit elements and the combination thereof so as to be obtained the delay value of the signal phase difference being minimum, it can be presented a timing control to be controlled within the board frequency ranges.

A second feature of the present invention presents a timing control circuit as mentioned in the first feature, wherein the selecting circuit includes a n inputs and 1 output selecting circuit for inputting the outputs from the respective delay circuit elements, the phase control circuit includes a phase detect circuit for comparing the signals to be inputted to the delay circuit with the phase of the output signals of the selecting circuit, a shift control circuit for outputting both of shift clocks and shift directional control signals on the basis of the phase difference information from the phase detect circuit, and a bi-directional shift register circuit of n bits for shifting a single set bit in bi-directions according to the shift clocks and shift directional control signals, and the delay control circuit includes a RS latch for employing as a set signal the output of the most highest bit within the bi-directional shift register, whereby the delay values of the delay circuit elements are changed by the output signals of the RS latch to change the whole delay amount of the delay circuit, and either one of the outputs from the delay circuit elements is selected so as to be minimum at most both of the phase difference of signals outputted by the n inputs and 1 output selecting circuit and the signal to be given to the delay circuit by the set bit within the bi-directional shift register circuit. With the above arrangement of the second feature, the signal delay circuit is provided with the one connected in series a plurality of the delay circuit elements for controlling the delay values with connecting commonly the delay control signals of the respective delay circuit elements so as to be able to change simultaneously the delay values of the whole delay circuits, and the delay controls are controlled by the combination of the selecting circuit, bi-directional shift register circuit and delay control circuit to control the total delay amount of the delay circuit so that the wide range in frequencies of timing control can be realized.

A third feature of the present invention presents a timing control circuit as mentioned in the first feature, wherein the delay circuit includes a plurality of delay lines for delaying for fixed periods each different to the other with inputting a given signal as a common input, a delay line selecting circuit for selecting one of the outputs within the outputs of the plurality of delay lines, and the one connected in series with n pieces of the delay circuit elements having a certain delay value with inputting the output signals of the delay line selecting circuit, the selecting circuit includes a (n+1) inputs and one output selecting circuit for inputting both of the output signals of the delay line selecting circuit and the respective delay circuit elements, the phase control circuit includes a phase detecting circuit for comparing the phase of output signals of the selecting circuit with signals to be given to the delay circuit, a shift control circuit for outputting shift clocks and shift directional control signals on the basis of the phase difference information form the phase detecting circuit, and a bi-directional shift register circuit for shifting in bi-directions the single set bit according to the shift clocks and shift directional control signals, and the delay control circuit includes an overflow detecting circuit for detecting that the set bit within the bi-directional shift register circuit has remained at the most highest bit for a certain time, and a delay line selecting control circuit for changing by the output signals of the overflow detecting circuit the outputs of the delay lines to be selected by the delay line selecting circuit within the delay circuit, whereby the delay amount necessary for the phase synchronization can be obtained by changing the delay values of the whole delay circuit, and either one of outputs from the delay circuit elements can be selected so as to be minimum at most the phase difference between the signals outputted by the (n+1) inputs and 1 output selecting circuit and the signal to be given to the delay circuit by the set bit within the bi-directional shift register circuit. With the arrangement of the third feature, the clock signals are delayed with the delay lines having previously different delay amount prior to the inputting of the clock signals into the signal delay circuit capable of controlling the delay amount, the delayed clock signals further are delayed with the signal delay circuit, the position information of the set bit within the bi-directional shift register circuit at this time is feedback, one of the plurality of delay lines is selected so that it may be in the range capable of controlling the timing with the signal delay circuit, resulting in that the broad ranges in frequency of timing control can be realized.

A fourth feature of the present invention provides a timing control circuit as mentioned within the first feature, where the delay circuit includes a 2 inputs and 1 output selecting circuit of n pieces connected in series a first delay circuit and a second delay circuit each of which connected in series by n pieces the delay circuit elements for outputting given signals with delaying for a constant time and for selecting either one of the outputs of the mth numbered delay circuit element ($1 \leq m \leq n$, m is an integer.) of the second delay circuit or the mth numbered delay circuit element of the first delay circuit, the selecting circuit includes a n inputs and 1 output selecting circuit for inputting the outputs of the respective selecting circuit elements, the phase control circuit includes a phase detecting circuit for comparing the phases of output signals of the selecting circuit and the signals to be given to the delay circuit, a shift control circuit for outputting clock signals and shift directional control signals on the basis of the phase difference information of the phase detecting circuit, and a bi-directional shift register circuit of n bits for shifting the single set bit in bi-directions according to the shift clocks and shift directional control signals, and the delay control circuit includes a RS latch for employing as a set signal the output of the highest bit within the bi-directional shift register circuit, whereby the selecting circuit elements within the delay circuit can change the selecting circuit to be selected by the output signals of the RS latch, and either one of the outputs of the selecting circuit elements within the delay circuit can be selected so as to be minimum the phase difference between the signals outputted from the n inputs and 1 output selecting circuit and the signals to be given to the delay circuit by the set bit within the bi-directional shift register circuit. With the above arrangement of the fourth feature, the signal delay circuit includes two sets of delay circuit elements connected in series, each of which providing with a plurality of delay circuit elements connected in series, and a mechanism being able to select either one of the outputs from the delay circuit elements within the two sets of delay circuits, and the desired amount of delaying can be obtained by changing two sets of delay circuits upon controlling the delay control signals in the combination of the selecting circuit., bi-directional shift register circuit and delay control circuit so that it can be realized to provide a timing control in the broad ranges of frequency.

A fifth feature of the present invention resides in a timing control circuit comprising a delay circuit for having, connected in series by n pieces ($n \geq 2$, n is an integer), delay circuit elements having a plurality of delay values for delaying, outputting by a constant time the given signals, a delay control register of n bits for selecting a specific delay of the delay circuit elements, a (n+1) inputs 1 output selecting circuit with clock signals to be inputted to the delay circuit and the respective outputs of the delay circuit elements being inputted, a bi-directional shift register circuit of (n+1) bits for shifting the single set bit in the bi-directions, where the selecting operation of the (n+1) inputs and 1 output selecting circuit can be controlled by the set bit within the bi-directional shift register circuit. With the arrangement of the fifth feature, the signal delay circuit employs the plurality of delay circuit elements connected in series for controlling the delay amount, the respective delay circuit elements consisting of the signal delay circuit are controlled independently by the data held by the delay control register, and the desired amount of delaying is selected in the combination of the selecting circuit and bi-directional shift register circuit, resulting in that it can be realized to provide a timing control in the broad ranges of frequency.

BRIEF DESCRIPTION OF THE DRAWINGS

These and other objects and features of the present invention will become apparent from the following description taken in conjunction with the preferred embodiment thereof with reference to the accompanying drawings, in which.

DETAILED DESCRIPTION OF THE INVENTION

Figure 1:
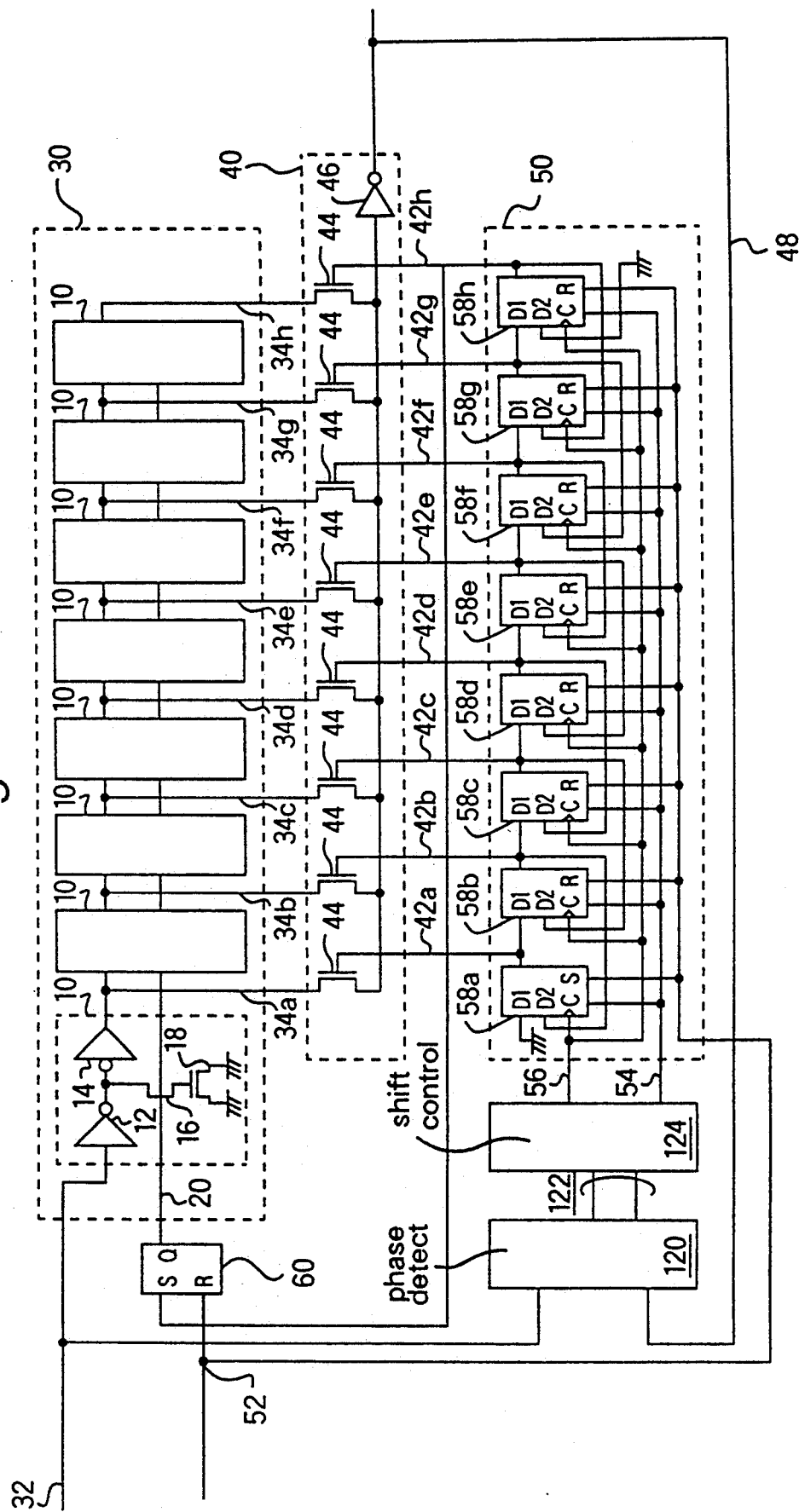
FIG. 1 is a block diagram showing the construction of a timing control circuit in a first embodiment of the present invention.

Before the description of the present invention proceeds, it is to be noted that like parts are designated by like reference numerals throughout the accompanying drawings.

Embodiment 1

FIG. 1 shows the construction of a timing control circuit in a first embodiment of the present invention, with a signal delay circuit 10 being used by eight (n=8) as a signal delay circuit 30. Assume that two types of delay values are provided as a delay circuit element 10 for brief description. It is needless to say that a plurality of (two types or more) delay values are provided as a delay circuit element 10.

A delay circuit element 10 has an invertor 12 and an invertor 14 connected in series, a drain of a first N channel MOS transistor 16 connected to the output of an invertor 12, a delay control signal 20 connected to the gate of a first N channel MOS transistor 16, a source of a first N channel MOS transistor 16 connected to the gate of a second N channel MOS transistor 18, and also, a drain and source of the second N channel MOS transistor 18 both connected to a ground electric potential. A signal delay circuit 30 is connected in series with eight delay circuit elements, gives a clock signal 32 to the input of the invertor 12 within a first stage of delay circuit element 10, the output of the invertor 14 within each delay circuit element 10 being made first through eighth delay clock signals 34a through 34h, a delay control signal 20 to be given to each delay circuit element 10 being connected in common. A selecting circuit 40 is composed of a 8 input 1 output select circuit to be controlled with eight selecting control signals 42a through 42h, and a buffer circuit 46. A bi-directional shift register circuit 50 is composed of a shift register using eight registers (flip-flop) to be controlled with a reset signal 52, a shift direction control signal 54, and a shift clock 56 so as to output values the respective registers 58a through 58h retain, outputs the values the respective registers 58a through 58h retain as the selecting control signals 42a through 42h. A delay control circuit 60 is a RS latch having a set input (S) and a rest input (R). A phase detecting circuit 120 is a circuit having a function of detecting the phase difference of the clock signal 32 and the internal clock 48 so as to generate a phase difference signal 122 synchronized with the internal clock 48. The shift control circuit 124 is a circuit having a function of generating the shift direction control signal 54 and a shift clock 56 with the phase difference signal 122 as a basis.

A timing control circuit of the present embodiment is composed of a signal delay circuit 30 and a selecting circuit 40 constructed in the above described manner, a bi-directional shift register circuit 50, a delay control circuit 60, a phase detecting circuit 120, a shift control circuit 124. The delay clock signals 34a through 34h are inputted to the 8 input 1 output select circuit within the selecting circuit 40. Selecting control signals 42a through 42h to be outputted from the bi-directional shift register circuit 50 are inputted to a selecting circuit 40, the clock signal 32 and the internal clock signal 48 are inputted to a phase detecting circuit 120, the phase difference signal 122 is inputted to the shift control circuit 124, the shift direction control signal 54 and the shift clock 56 are inputted to the bi-directional shift register circuit 50, the output of the delay control circuit 60 is made the delay control signal 20 with the reset signal 52 and the selecting control signal 42h being made respectively a reset input and a set input of the delay control circuit 60.

A timing control circuit in the present embodiment constructed as described hereinabove will be described hereinafter in its operation.

In the delay circuit element 10, a first N channel MOS transistor 16 becomes a switch circuit to turn on•off with a signal to be given to the delay control signal 20, and a second N channel MOS transistor 18 becomes a capacitive load. When the delay control signal 20 becomes a "L" level, the first N channel MOS transistor 16 becomes off and the capacitive load composed of the second N channel MOS transistor 18 is separated, and the delay in the delay circuit element 10 becomes $\tau 0$ (=delay when the first N channel MOS transistor 16 is off). On the other hand, when the delay selecting signal 20 becomes the "H" level, the first N channel MOS transistor 16 becomes on, the capacitive load which is composed of a second N channel MOS transistor 18 is connected so as to make the delay $\tau 1$ (=delay when the first N channel MOS transistor 16 is on), (here clearly $\tau 0 < \tau 1$). By the controlling of the delay control signal 20 to "L" or "H", the delay in the output (=either of the delay clock signal 34a through 34h) of a m th ($1 \leq m \leq n=8$, m is an integer) of the signal delay circuit 30 can be controlled to bi-directional values of m X $\tau 0$ or m X $\tau 1$.

The selecting circuit 40 selects one signal from among the delay clock signals 34a through 34h with the use of the selecting control signals 42a through 42h. In the present embodiment, a 8 input 1 output select circuit is composed with eight N channel MOS transistors 44. After the wave-form shaping with the use of a buffer circuit 46, a selecting circuit adapted to output as an internal clock 48 is used.

A bi-directional shift register circuit 50 shifts the set bit with the use of the shift direction control signal 54 and a shift clock 56. The shift direction control signal 54 and the shift clock 56 are given by a shift control circuit 124 to be controlled by the phase detecting circuit 120 so as to change the condition where the phase difference has been detected between the clock signal 32 and the internal clock signal 48 in the phase detecting circuit 120. The shift direction control signal 54 is converted into the shift direction information of the phase advance/delay. The shift clock 56 is a pulse synchronized with an internal clock signal 48 to be generated only when the phase difference has been caused. The set bit exists one within the registers 58a through 58h within bi-directional shift register circuit 50, and the others are all reset bits. The set bit certainly exists in either of the registers 58a through 58h within the bi-directional shift register circuit 50. When it has been shifted to the end of the shift register, it is controlled not to be shifted further. Reset signals 52 are inputted to all the registers 58a through 58h, and are used to give the initial values to all the register. The initial value only of a register 58a is made "H", and the others are all made "L". The set bits are adapted to be set only in the least significant register 58a. The set bit and the rest bit become selecting control signals 42a through 42h of the 8 input 1 output select circuit within the selecting circuit 40, select one within the delay signals 34a through 34h within a signal delay circuit corresponding to the set bit so as to control for outputting it as the internal clock 48. The delay clock signal corresponding to the reset bit is not selected. In this manner, the signal delayed by a given delay is taken out from the signal delay circuit 30 so as to output it as the internal clock 48.

A delay control circuit 60 generates delay control signal 20 with the use of a reset signal 52 and a selecting control signal 42h. When the reset signal 52 is a "H", the delay control signal 20 becomes a "L". This condition shows a case where the whole circuit has been initialized by the reset signal 52, the delay control signal 20 is made the "L" to control so that the delay by the delay circuit element 10 is made smaller. When the selecting control signal 42h is "H", the delay control signal 20 becomes "H". In this condition shows a case where a delay clock signal 34h large in the delay has been selected due to the small delay by the delay circuit element 10. The delay control signal 20 is set to the "H" so as to control so that the delay by the delay circuit element 10 may be large.

Figure 2:
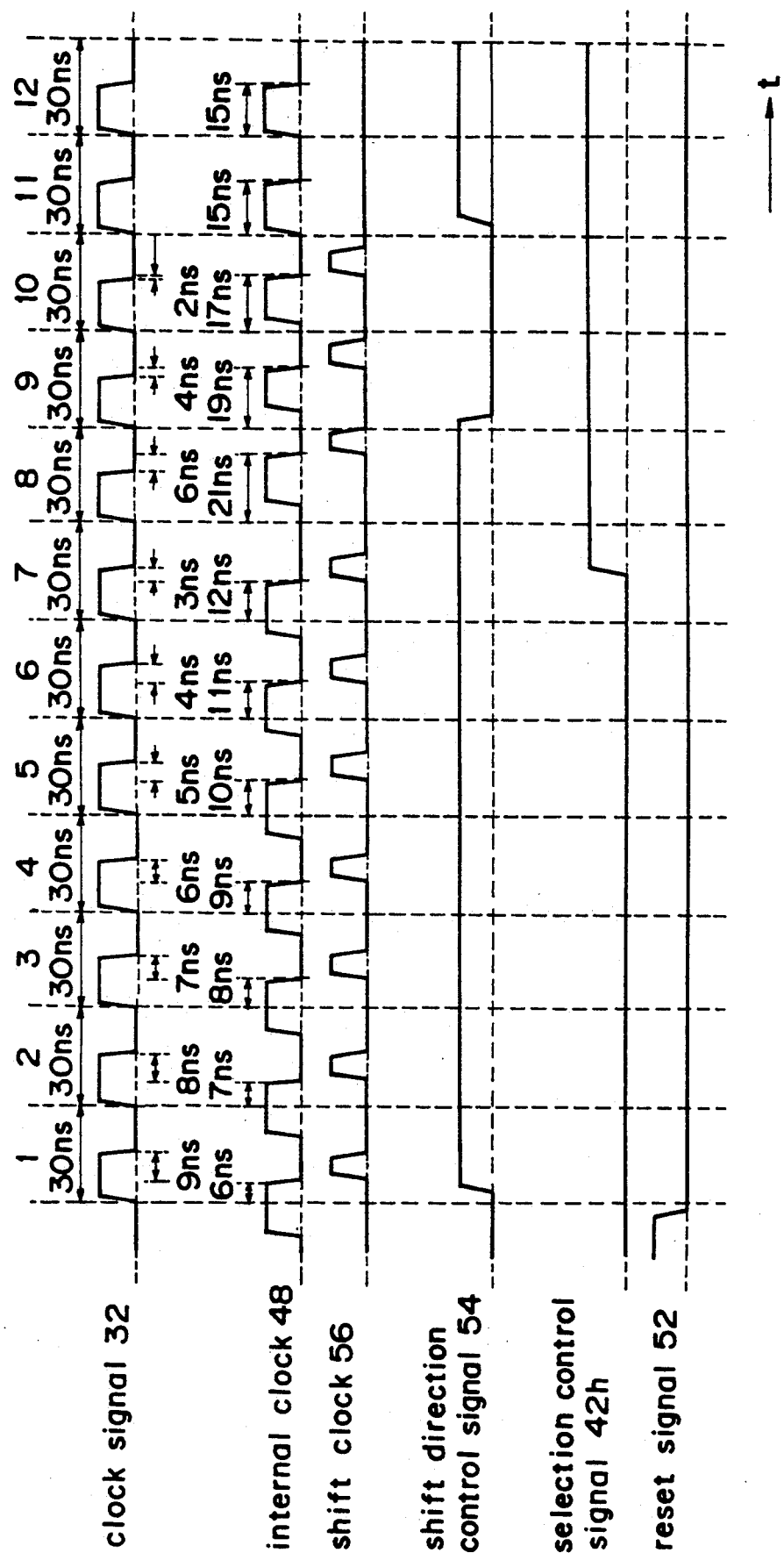
FIG. 2 shows timing charts showing the operation of the timing control circuit in the first embodiment of the present invention.

The above described operation expressed in the timing charts is shown in FIG. 2. In FIG. 2, assume that the period of the clock signal 32 is made 30 ns, the delay of the signal in the selecting circuit 40 is made 5 ns (including the delay of the buffer circuit 46 by the load of the internal clock 48), with $\tau 0 = 1$ ns, $\tau 1 = 2$ ns. In the next cycle with the reset signal 52 being the "L", the delay clock signal 34a is selected, with the phase of the internal clock 48 advances by 9 ns (=15 ns - 5 ns - 1 ns) with respect to the phase of the clock signal 32. The phase detecting circuit 120 detects the advance of the phase to give instructions so that the set bit may be shifted to the bi-directional shift register circuit 50 through the shift control circuit 124. In the following cycle (second cycle) by the instructions, the delay clock signal 34b is selected. Then, the operation is repeated and the delay clock signal 34h is selected at the seventh cycle. When the delay clock signal 34h is selected, namely, when the selecting control signal 42h is activated, the RS latch of the delay control circuit 60 is set by the activated selecting control signal 42h to make the delay selecting signal 20 the "H". Thus, the respective value of the delay circuit element becomes $\tau 1$ (=2 ns), and the whole delay of the signal delay circuit 30 becomes 16 ns (=$\tau 1 \times 8$). Therefore, in the eighth cycle, the phase of the internal clock 48 is delayed by 6 ns (=16 ns+5 ns −15 ns) with respect to the phase of the clock signal 32. The phase detecting circuit 120 detects the delay of the phase to give instructions so that the set bit may be shifted in the inverse direction to the bi-directional shift register circuit 50 through the shift control circuit 124. By the instructions, the phase delay becomes 4 ns (as $\tau 1 = 2$ ns, it changes by 2 ns) at a ninth cycle. Thereafter, the operation is repeated. The phase agrees at an eleventh cycle.

Figure 3:
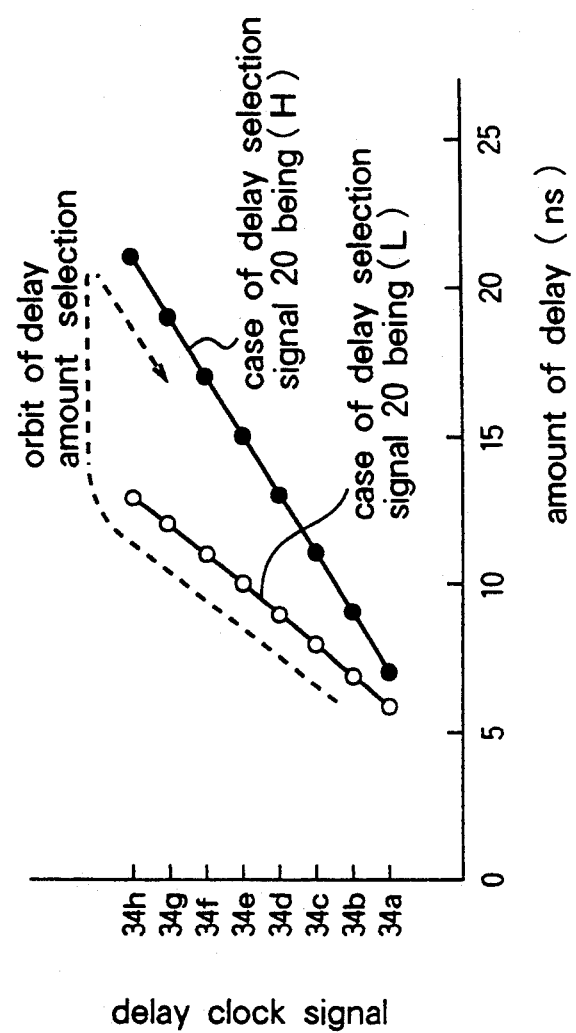
FIG. 3 is a diagram showing the timing control range of the timing control circuit in the first embodiment of the present invention.

The general state of the operation is shown in FIG. 3. The delay disposed immediately after resetting is 6 ns including the delay of signal in the selecting circuit 40. The orbit of the delay selection up to the phase synchronization is shown with the one of dotted lines in FIG. 3. In this embodiment, when the delay selecting signal 20 is equal to (L), the delay is 6 ns to 13 ns which can correspond to a specific frequency residing within the ranges of 83. 3 to 38. 5 MHZ in frequency conversion, and, when the delay selecting signal 20 is equal to (H), the delay is 7 ns to 21 ns which can correspond to a specific frequency residing within the ranges of 71. 4 to 23. 8 MHZ in frequency conversion.

According to the present embodiment, a switching circuit and a capacitive load connected with it are provided a signal delay circuit 30. A delay circuit element 10 which is capable of controlling the delay by the controlling of the switching circuit on•off is used. By the combination of the delay value control using the delay control signal 20, the selecting circuit 40, the bi-directional shift register circuit 50 and the delay control circuit 60, the information of the phase control is dynamically feedback to the signal delay circuit 30 so as to select the desired delay so that the range of the phase control in the signal delay circuit 30 can be controlled. In the present embodiment, the delay control range of the signal delay circuit 30 in a case of the delay control signal 20 = "L" becomes 1 through 8 ns, the delay control range of the signal delay circuit 30 in a case of the delay control signal 20 = "H" becomes 2 through 16 ns. The timing control circuit in the present embodiment can stably operate even with respect to the frequency variation of the clock signal 32 to be inputted as the delay per the delay circuit element 10 can be dynamically controlled with the use of the delay control circuit 60. In order to effect the smooth phase control, the delay of the whole signal delay circuit 30 in a case of the delay control signal 20 = "L" is desired to be set larger than the delay value per the delay circuit element 10 in a case of the delay control signal 20 = "H". The delay of the whole signal delay circuit 30 is desired to be set with overlap in a case of the delay control signal 20 = "L" and in a case of the delay control signal 20 = "H".

As is clear from the results, two-way of delays can be controlled by one signal delay circuit 30 so that the control range may be widened or narrowed in spite of the same stage member of the delay circuit elements. The signal delay information at a certain time is feedback to set the next delay value with the use of the delay control circuit 60 so that the delay can be dynamically controlled. With the use of the signal delay circuit 30 constructed with the use of the delay circuit element 10 which is capable of controlling a plurality types of delays the feedbacking of the information of the bi-directional shift register circuit 50 for controlling the selection of the delay value to the signal delay circuit 30 through a delay control circuit 60 becomes a point of the timing control circuit in the present embodiment.

Figure 4:
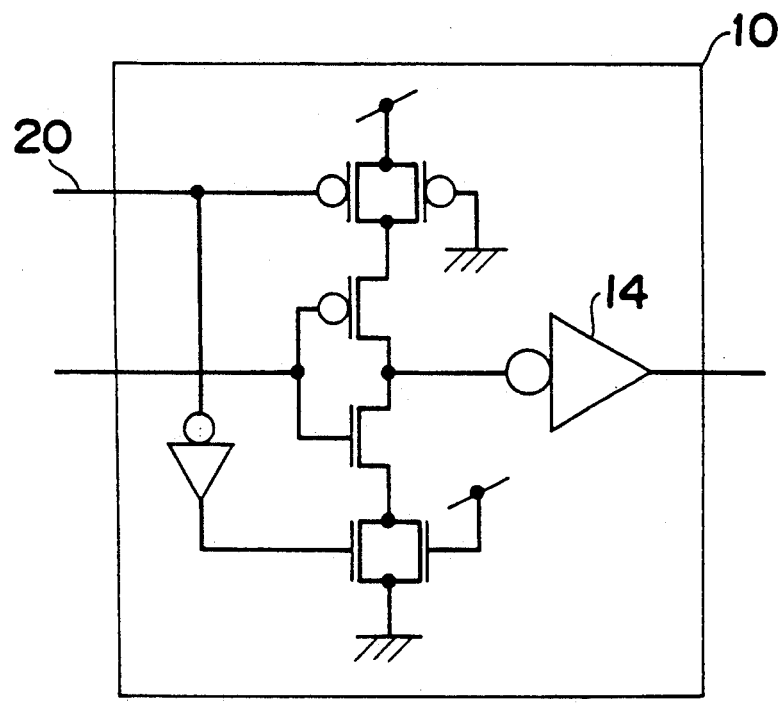
FIG. 4 is a circuit diagram showing the other construction example of a delay circuit element.

As the delay circuit element 10, the drain of a first N channel MOS transistor 16 connected to the output of the invertor 14, instead of the output of the invertor 12, may be used. The first and second MOS transistors 16 and 18 to be used in the delay circuit element 10, and a N channel MOS transistor 44 to be used in the selecting circuit 40 are not necessary to be restricted to the N channel MOS transistor. Joint uses with the P channel MOS transistor, the N channel MOS transistor and the P channel MOS transistor can be effected, and the selection in accordance with the design can be properly effected. Especially, the second MOS transistor 18 is not made necessary to become a transistor, anything if it becomes a capacitive load can be used. For example, capacity between wiring and substrate or capacity between duffusion laye and substrate may be used. A delay circuit element composed of an invertor capable of adjusting the driving performance with the control signal and a series connection of the normal invertor 10 may be used as shown in FIG. 4 as the delay circuit element 10. Any circuit if it is a circuit capable of changing the delay value with the control signal may be used. In addition, though this embodiment employs the selecting circuit 40 consisting of the N channel MDS transistor, any kinds of constructions may be employed so long as providing the same operation of the selecting circuit 40. A clock generating circuit having various functions for generating a polyphase clock from the single phase, instead of the buffer circuit 46, may be used.

Embodiment 2

Figure 5:
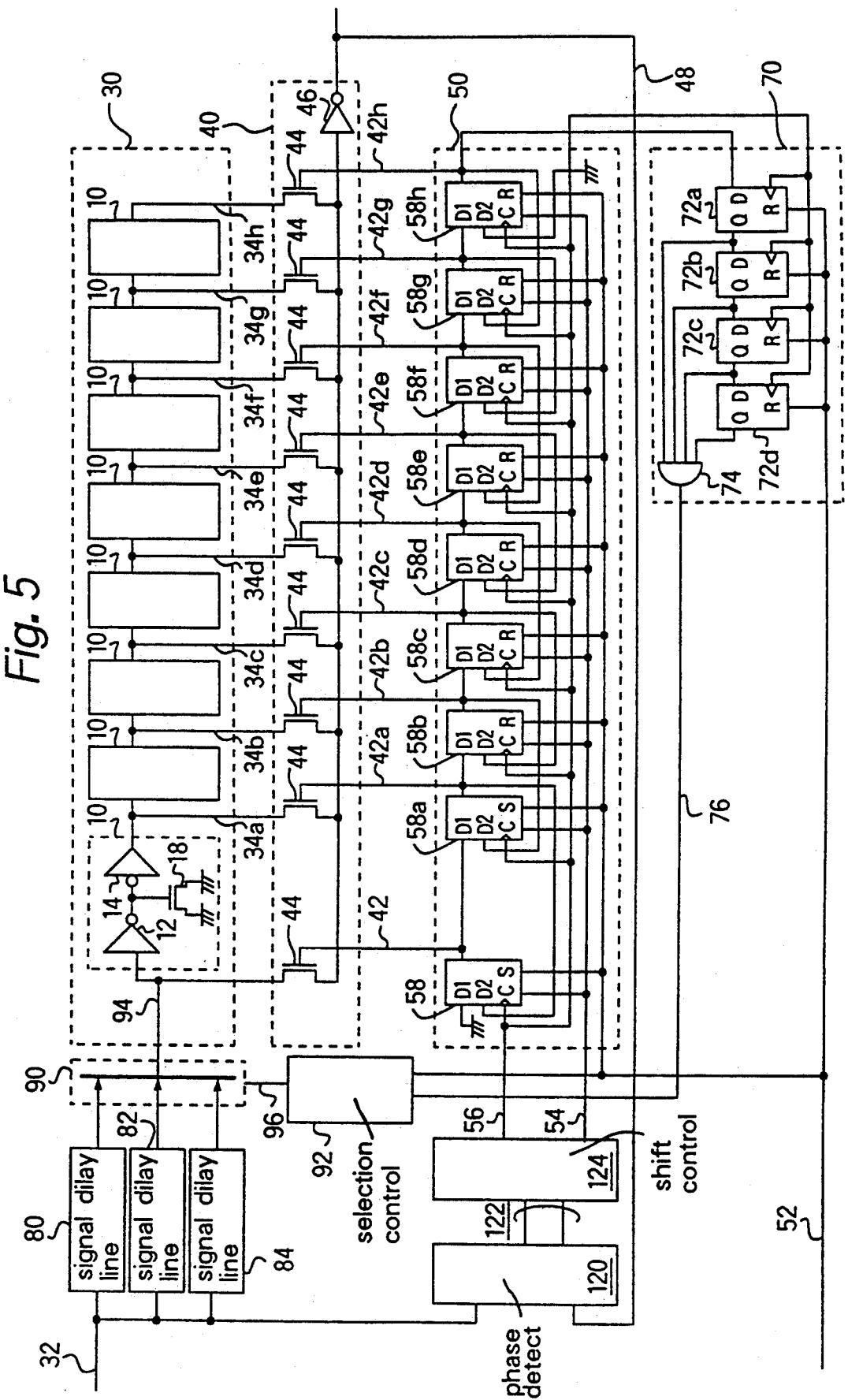
FIG. 5 is a block diagram showing the construction of a timing control circuit in a second embodiment of the present invention.

A timing control circuit in a second embodiment of the present invention will be described hereinafter with reference to the drawings. FIG. 5 shows the construction of a timing control circuit in the second embodiment of the present invention. Three delay lines are considered as delay lines for delaying the clock signals for a fixed period only, and eight (n=8) signal delay circuits 10 as signal delay circuits 30.

The delay circuit element 10 has an invertor 12 connected in series with an invertor 14, an output of the invertor 12 connected with the gate of the N channel MOS transistor 18, with the drain and source of the N channel MOS transistor 18 are both connected with a ground electric potentials. A signal delay circuit 30 has eight (n=8) delay circuit elements 10 connected in series, the output of the invertor 14 within each delay circuit element 10 provided as first through eighth delay clock signals 34a through 34h. A selecting circuit 40 is composed of 9 input 1 output select circuit to be controlled by the nine selecting control signals 42, 42a through 42h and a buffer circuit 46. A bi-directional shift register circuit 50 is composed of a shift register using nine registers (flip-flops) 58, 58a through 58h to be controlled with a reset signal 52, a shift direction control signal 54, a shift clock 56. Values respective registers 58, 58a through 58h retain are outputted as selecting control signals 42, 42a through 42h. The overflow detecting circuit 70 is composed of four bit shift registers using four registers (flip-flops) 72a through 72d to be controlled with a selecting control signal 42h which is retained by the most significant register 58h of the bi-directional shift register circuit 50, a shift clock 56, a reset signal 52, and a "and" circuit 74 which inputs four outputs of registers 72a through 72d. The overflow signal 76 is outputted from the "and" circuit 74. Three signal delay lines 80, 82, 84 are delay lines having delay each different, constructed with invertor chain and so on with the delay being 80<82<84. A delay line selecting circuit 90 is a 3 input 1 output selecting circuit so as to output the fixed delay clock signal 94. The delay line selecting control circuit 92 is composed of a shift register to be controlled with a reset signal 52 and an overflow signal 76 so as to output a delay line selecting control signal 96. A phase detecting circuit 120 is a circuit having a function of detecting the phase difference of the clock signal 32 and the internal clock 48 so a to generate the phase difference signal synchronized with the internal clock 48. A shift control circuit 124 is a circuit having a function of generating a shift direction control signal 54 and a shift clock 56 with the phase difference signal 122 being a basis so as to control the shift operation of the bi-directional shift register circuit 50.

The timing control circuit of the present embodiment is composed of a signal delay circuit 30, a selecting circuit 40, a bi-directional shift register circuit 50, an overflow detecting circuit 70, a signal delay lines 80, 82, 84, a delay selecting circuit 90, a delay selecting control circuit 92, a phase detecting circuit 120, a shift control circuit 124. The clock signals 32 are inputted in common to signal delaying lines 80, 82, 84, the respective outputs of the signal delay lines 80, 82, 84 are inputted to the delay line selecting circuit 90, a fixed delay clock signal 94 and eight delay clock signals 34a through 34h of the signal delay circuit 30 are inputted into a 9 input 1 output select circuit within the selecting circuit 40, nine selecting control signals to be outputted from the bi-directional shift register circuit is inputted to the selecting circuit 40, the clock signal 32 and the internal clock signal 48 are inputted to the phase detecting circuit 120, a phase difference signal 122 is inputted to the shift control circuit 124, a shift direction control signal 54 and a shift clock 56 are inputted to the bi-directional shift register circuit 50, a reset signal 52 and a selecting control signal 42h are inputted into an overflow detecting circuit 70, a reset signal 52 and an overflow signal 76 are inputted to the delay line selecting control circuit 92, the delay line selecting control signal 96 is inputted to the delay line selecting circuit 90.

A timing control circuit in the present embodiment constructed as described hereinabove will be described hereinafter in its operation.

In the delay circuit element 10, the N channel MOS transistor 18 becomes a capacitive load so as to constitute a delay element with inverters 12, 14 being combined. Assume that the delay in the delay circuit element 10 is $\tau 2$, and the delay in the output (=either of delay clock signals 34a through 34h) of a t th ($0 \leq t \leq n = 8$, t is an integer) of a signal delay circuit 30 with the eight delay circuit elements 10 being connected in series becomes $t \times \tau 2$ so that nine way of delay can be obtained.

A selecting circuit 40 selects one signal from among the fixed delay clock signal 94 and eight delay clock signals 34a through 34h with the use of nine selecting control signals 42, 42a through 42h. In the present embodiment, the nine N channel MOS transistors 44 constitute a select circuit of a 9 input 1 output. After the wave-form shaping with the use of a buffer circuit 46, a selecting circuit adapted to output as an internal clock 48 is used.

A bi-directional shift register circuit 50 shifts the set bit with the use of the shift direction control signal 54 and a shift clock 56. The shift direction control signal 54 and the shift clock 56 are given by a shift control circuit 124 to be controlled by the phase detecting circuit 120 so as to change the condition when the phase difference has been detected between the clock signal 32 and the internal clock signal 48 in the phase detecting circuit 120. The shift direction control signal 54 is converted into the shift direction information of the phase advance/delay. The shift clock 56 is a pulse synchronized with an internal clock 48 to be generated only when the phase difference has been caused. The set bit exists in the only one of the registers 58, 58a through 58h within the bi-directional shift register circuit 50, and the others are all reset bits. The set bit certainly exists in either of the register 58, 58a through 58h within the bi-directional shift register circuit 50. When it has been shifted down to the end of the shift register, it is controlled not to be shifted further. Reset signals 52 are inputted to all the registers 58, 58a through 58h, and are used to give the initial values to all the registers 58, 58a through 58h. Only the initial value of the register 58 is made "H", and the others are all made "L". The set bit is adapted to be set only in the least significant register 58. The set bit and the reset bit become selecting control signals 42, 42a through 42h of the 9 input 1 output select circuit within the selecting circuit 40, select one of the signals corresponding to the set bits from the delay signals 34a through 34h within the signal delay circuit 30 and a fixed delay clock signal 94, control for outputting it as the internal clock 48. The delay clock signal corresponding to the reset bit is not selected. In this manner, the signal delayed by a given delay is taken out from the signal delay circuit 30 so as to output it as the internal clock 48.

An overflow detecting circuit 70 takes in the data (=selecting control signal 42h) retained in the most significant register within the bi-directional shift register circuit 50 synchronizing with a shift clock 56 and shifts it. All the outputs of the registers 72s through 72d for constituting the shift register within the overflow detecting circuit 70 are inputted into the "and" circuit 74. Only when all the outputs of the registers 72a through 72d have become "H", the "H" is outputted as the overflow signal 76. By the control, it is known that the delay of the signal has reached the maximum value of the delay control range in the signal delay circuit 30. In the case of the present embodiment, the selecting control signal 42 continues to become "H" while the shift clock 56 is generated four times (shift register is adapted to be constructed by four registers 72a through 72d), the overflow signal 76 becomes "H". While the shift clock 56 is caused four times, the selecting signal 42 continues to be "H" in conditions. If the delay of the signal has reached a maximum value of the delay control range in the signal delay circuit 30 at the timing of a certain shift clock 56, it does not reach the maximum value of the delay control range at the timing of the shift clock 56 continuously as a result of the phase comparing operation in the phase detecting circuit 120. It is judged that the maximum value of the delay control range has been exceeded by continuously taking the maximum value of the delay control range of a certain given period (here a period during which a shift clock 56 has generated four times). The reset signals 52 are inputted to all the registers 72a through 72d and are used to give the initial value to all the registers 72. The initial values in this case are all "L". In the present embodiment, registers 72a through 72d for composing the shift register are adapted to be four. The number thereof will do if it is one or more. It may be properly set in accordance with a design.

The signal delay lines 80, 82, 84 are delay lines, each being different in delay, made of invertor chain or the like, delay a given period clock signal with the clock signal 32 as common input so as to output it. Here in the present embodiment, the size relation of the delay is assumed to be 80<82<84. In the present embodiment, the number of the signal delay lines is three. It will do if the number thereof is two or more. It can be properly set in accordance with a design.

Figure 6:
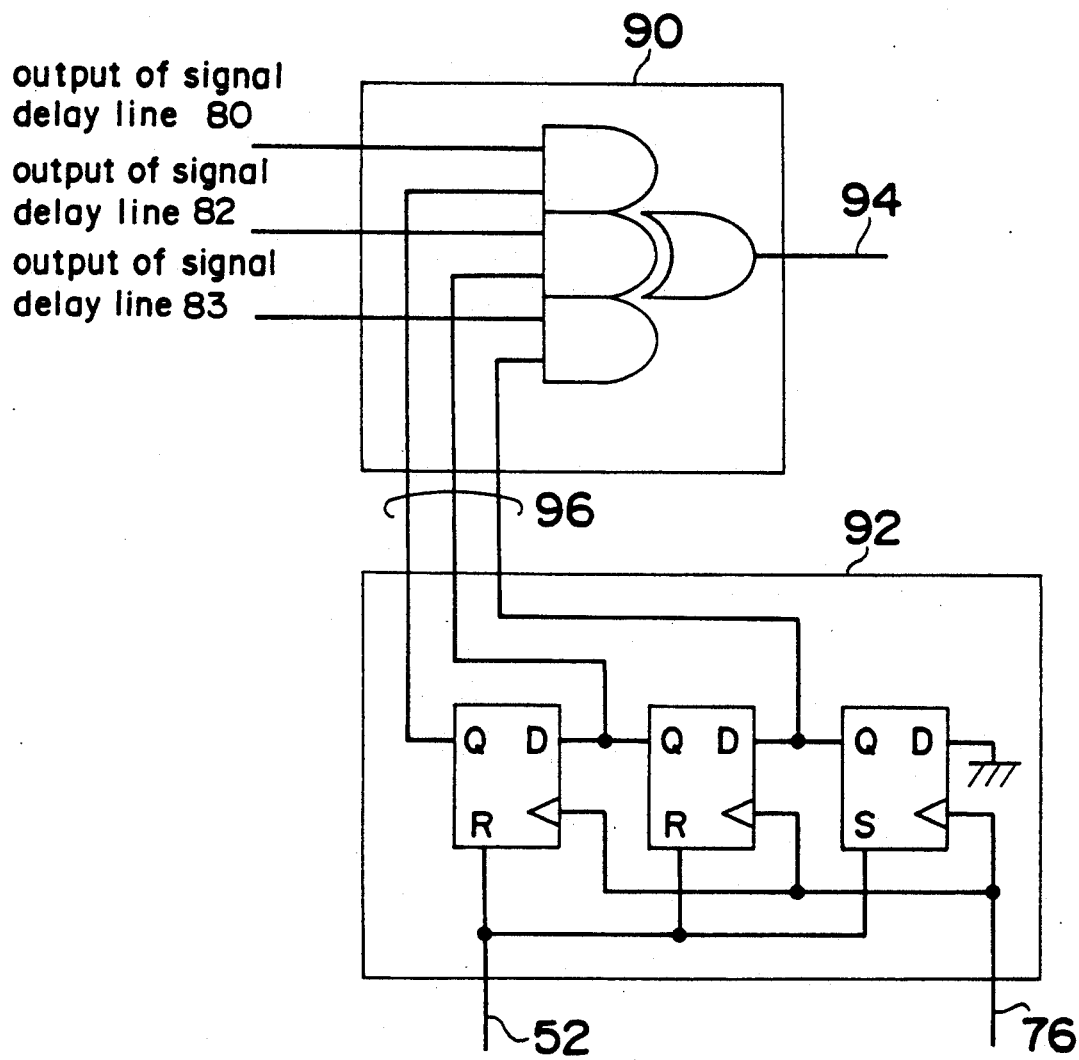
FIG. 6 is a circuit diagram showing the construction example of a delay line selecting circuit 90 and a delay line selecting control circuit 92.

The delay line selecting circuit 90 is a 3 input 1 output select circuit as shown in FIG. 6. One is selected from three inputs in accordance with the control of the delay line selecting control signal 96 and is outputted as the fixed delay clock signal 94. In the present embodiment, the delay line selecting circuit 90 is adapted to be composed of a 3 input 1 output select circuit. The number of the inputs is not limited, and can be properly set in accordance with the number of the signal delay lines to be used.

As shown in FIG. 6, a delay line selecting control circuit 92 generates a delay line selecting control signal 96 with an overflow signal 76, a reset signal 52 so as to control the delay line selecting operation in the delay line selecting circuit 90. Namely, if the reset signal 52 becomes the "H", the overflow signal 76 never becomes the "H", the output of the signal delay line 80 is selected. If the overflow signal 76 becomes "H", the output of the signal delay line 82 is selected. When the overflow signal 76 continuously becomes "H", the output of the signal delay line 84 is selected.

Figure 7:
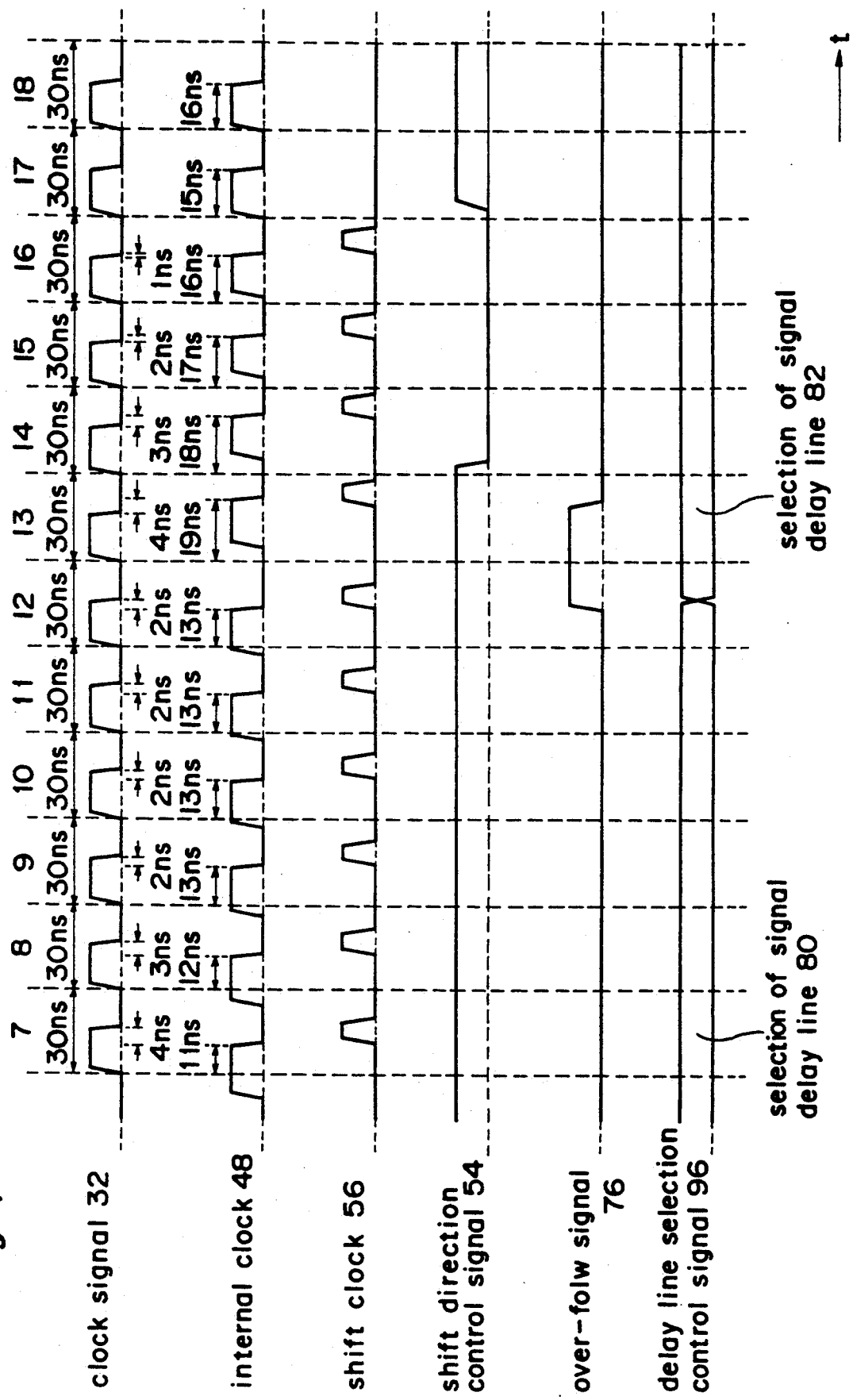
FIG. 7 shows a timing charts showing the operation of a timing control circuit in the second embodiment of the present invention.

The above described operation expressed in timing charts is shown in FIG. 7. In FIG. 7, assume that the period of the clock signal 32 is 30 ns, the delay of the signal in the selecting circuit 40 is 3 ns (including the delay of a buffer circuit 46 due to the load of the internal clock 48), the delay of the signal delay line 80 is 2 ns, the delay of the signal delay line 82 is 8 ns, the delay of the signal delay line 84 is 14 ns, $\tau 2 = 1$ ns. In FIG. 6, a seventh cycle and its subsequent after the reset signal 52 being made "L" are shown for brief description of the drawings. In a seventh cycle, the delay clock signal 34f is selected. At the time point, the phase of the internal clock 48 advances by 4 ns (=15 ns - 3 ns - 2 ns - 6 ns) with respect to the phase of the clock signal 32. The phase detecting circuit 120 detects the advance of the phase so as to give instructions so that the set bit may be shifted to the bi-directional shift register circuit 50 through the shift control circuit 124. The delay clock signal 34 g is selected with the next cycle (eighth cycle) by the instructions. Hereinafter, the operation is repeated, and the delay clock signal 34h is selected at a ninth cycle. In the same cycle, the information of the set bit is taken into the register 72a within the overflow detecting circuit 70. Hereafter, during three cycles, the set bit remains in the register 58h. During this period, the set bit information is taken into all the registers 72a through 72d within the overflow detecting circuit 70 and the overflow signal 76 is outputted at a twelfth cycle. Thus, the delay line selecting control circuit 92 gives instruction to the delay line selecting circuit 90. The signal delay line 82 is selected at a thirteenth cycle. The phase of the internal clock 48 is delayed by 4 ns (=8 ns+8 ns+3 ns - 15 ns) with respect to the phase of the clock signal 32. The phase detecting circuit 120 detects the phase delay and gives instructions so that the set bit may be shifted in the inverse direction to the bi-directional shift register circuit 50 through the shift control circuit 124. The phase delay becomes 3 ns at a fourteenth cycle with the instructions. Hereafter, the operation is repeated and the phase agrees at a seventeenth cycle.

According to the present embodiment, when the delay of the range where the controlling operation cannot be effected in the delay control range of the signal delay circuit 30, the clock signal is delayed with one of a plurality of delay lines 80, 82, 84 each being different previously in delay prior to the inputting of the clock signal to the signal delay circuit 30. Thereafter, the delay is controlled by the signal delay circuit 30, the selecting circuit 40, and bi-directional shift register circuit 50 so as to effect the timing control. The overflow detecting circuit 70 judges whether or not the timing control can be effected with the delay control range of the signal delay circuit 30 with the use of the information of the selecting control signal 42 of bi-directional shift register circuit 50. When the delay is necessary, instructions are given to the delay line selecting control circuit 92 to control so that the output of the signal delay line having larger delay may be selected by the delay line selecting circuit 90, thus realizing the wide range of timing control.

Assume that the signal delay circuits 30 in the conventional embodiment and the present embodiment are respectively eight stages of delay circuit elements, and the delay of one state portion of the delay circuit element is 1 ns, and the delay control range of the signal delay circuit 30 only is 0 through 8 ns only. In the present embodiment, assume that the delay values of the signal delay lines 80, 82, 84 are respectively 2, 8, 14 ns, and the delay control range in the range of 5 through 13 ns, 11 through 19 ns, 17 through 25 ns can be obtained in the whole timing control circuit. These values are respectively corresponding to a certain frequency disposed within the ranges of 100 to 38.5 MHZ, 45.5 to 26.3 MHZ and 29.4 to 20 MHZ in frequency conversion. In order to effect the smooth timing control, it is desired to overlap the delay of the whole timing control circuit when the signal delay lines 80, 82, 84 are used respectively. In the above described example, the overlap value is 2 ns.

As clear from the result, the delay is controlled with the use of signal wiring delay lines 80, 82, 84 having fixed delay and signal delay circuit 30 so as to detect by the overflow detecting circuit 70 what the delay has exceeded the range capable of controlling operation. The output from the signal delay line is dynamically switched automatically so that the timing control range can be widened or narrowed. The point of the timing control circuit of the present embodiment is that the output from the signal delay line is automatically switched dynamically in control with the use of the overflow detecting circuit 70.

The gate of the N channel MOS transistor 18 connected with the output of the invertor 14, instead of the output of the invertor 12, can be used as the delay circuit element 10. The N channel MOS transistor 44 to be used in the selecting circuit 40 is not necessary to be restricted to the N channel MOS transistor, can be properly selected in accordance with designs through joint uses of the P channel MOS transistor, the N channel MOS transistor and the P channel MOS transistor. The N channel MOS transistor 18 is not necessary to be the transistor. It may be either if it becomes a capacitive load. For example, capacity between wiring and substrate or capacity between duffusion laye and substrate can be used. It may be a series connection of the mere inverters 12, 14 without having the capacitive load. In an extreme argument, any circuit may be used if a circuit is capable of getting the desired extreme value. In addition, although in this embodiment the circuit consisting of N channel MOS transistor is employed as the selecting circuit 40, any kinds of constructions can be adapted so long as providing the same operation of the selecting circuit 40. Instead of a buffer circuit 46, a clock generating circuit of having various functions of getting polyphase clock from the simple clock can be used.

Embodiment 3

Figure 8:
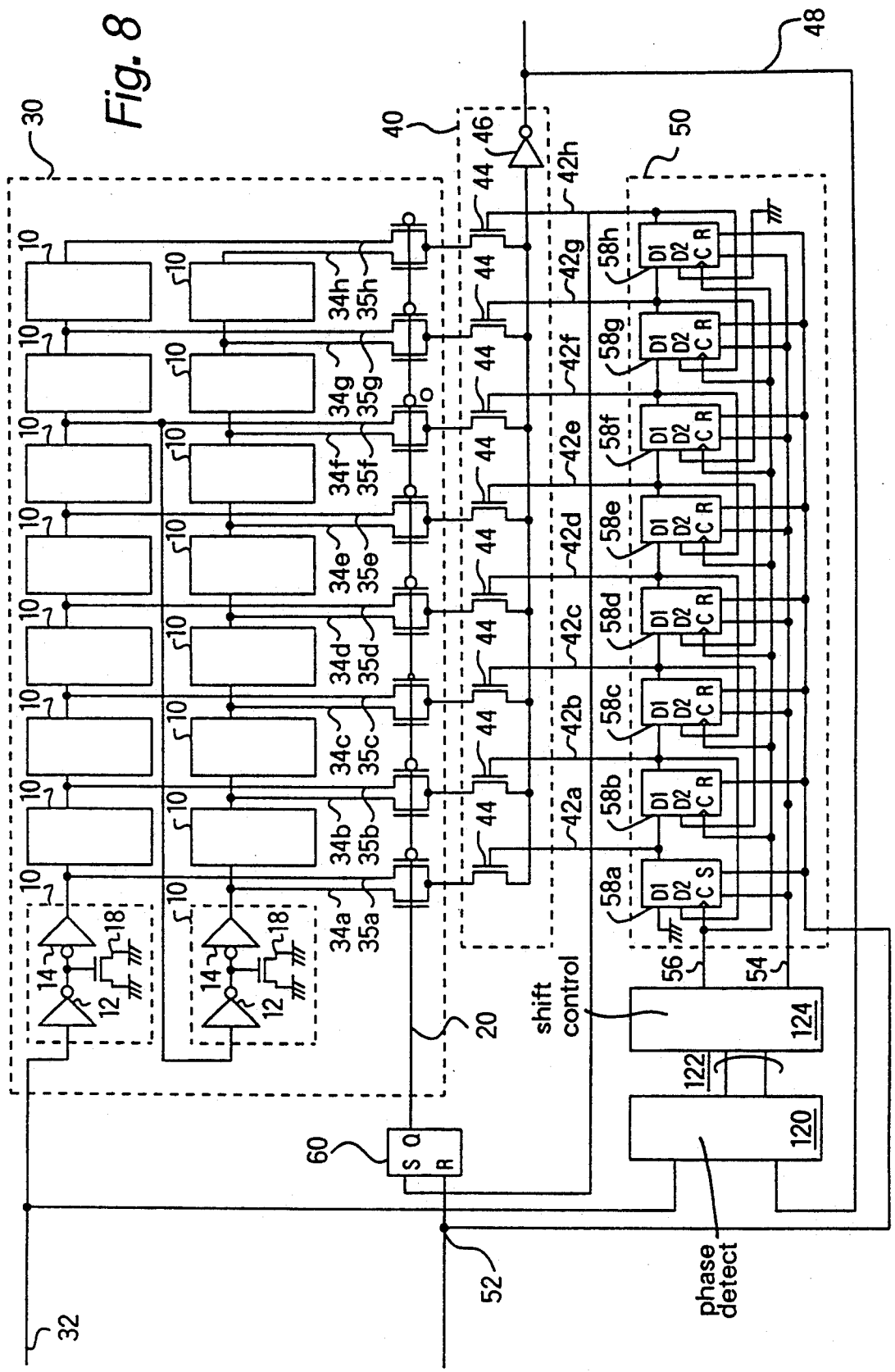
FIG. 8 is a block diagram showing the construction of a timing control circuit in a third embodiment of the present invention.

A timing control circuit in a third embodiment of the present invention will be described hereinafter with reference to the drawings. FIG. 8 shows the construction of a timing control circuit in the third embodiment of the present invention, wherein an arrangement of connecting in series a first delay circuit with a second delay circuit each circuit employing eight pieces (n=8) of the delay circuit elements 10 as a delay circuit consisting of the signal delay circuit 30.

The delay circuit elements 10 are the same ones to those of the second embodiment, with connecting each of the outputs 34a to 34h of delay circuit elements 10 consisting of the first delay circuit to the respective drains of MOS transistors of p channels in n pieces, each of the outputs 35a to 35h of delay circuit elements 10 consisting of the second delay circuit to the respective, corresponding drains of MOS transistors of p channels in n pieces, and the respective sources of MOS transistors of p channels in n pieces to the respective sources of MOS transistors of n channels in n pieces in common to provide delay clock signals of n pieces. The clock signal 32 is connected with the input of the first delay circuit, and the output 34f of delay circuit elements consisting of the first delay circuit is adapted as the output of the second delay circuit. The other elements and the connections thereof in the third embodiment are the same to those of the second embodiment.

The timing control circuit of the third embodiment will be described hereinafter in its operation. In the third embodiment, the construction of the signal delay circuit 30 is different to the one of the first embodiment, and there provides hereinafter only the explanation of operation of the signal delay circuit 30.

Since the delay control signal 20 is equal to "L" in the signal delay circuit 30 when resetting, the delay clock signals 34a to 34h connected with the sides of MOS transistors of p channels in n pieces is rendered to the state of being able to input into the selecting circuit 40. When the delaying amount of signals necessary for the phase synchronization between the internal clock signals 48 and clock signals 32 can be obtained by either one of the delay clock signals 34a to 34g, the timing can be controlled only by the first delay circuit. However, when it is not sufficient for the delay amount merely by the delay amount of the first delay circuit, the delay control circuit 60 is adapted to control by the phase detecting circuit 120, shift control circuit 124 and bi-directional shift register circuit 50 to provide the delay control signal 20 being equal to "H", and the delay clock signals 35e to 35h connected to the sides of MOS transistors of n channel in n pieces is rendered to the state of being inputted into the selecting circuit 40, thereby to cause to increase the further amount of delay.

When the sum of the delay of signals within the MOS transistors of p channel or the MOS transistors of n channel and the delay of signals within the selecting circuit 40 is 6 ns including the delay of buffer circuit 46 by loading onto the internal clock 48, and the delay in the delay circuit elements 10 is 1 ns, it can be obtained a range of delay controlling such as 7 ns to 22 ns at the total of timing control circuit, which is corresponding in the conversion of frequency to a certain frequency residing within the range of 71.4 of 22.7 MHz.

Although in the third embodiment the MOS transistors of p channel and MOS transistors of n channel are respectively employed for changing the respective outputs of delay circuit elements within the first delay circuit and delay circuit elements within the second delay circuit, it can be employed any kinds of constructions which present the same operation of the MOS transistors.

Embodiment 4

Figure 9:
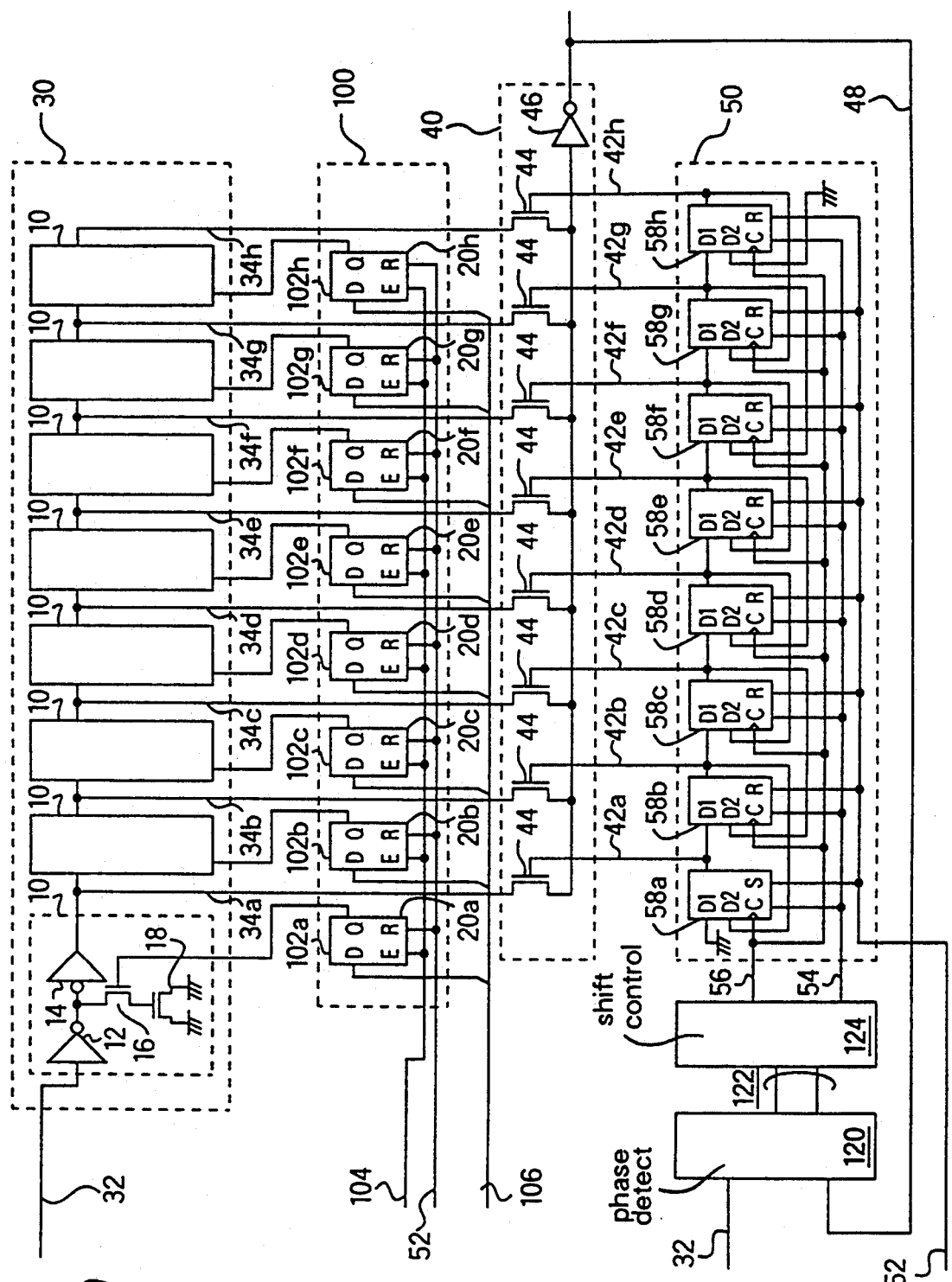
FIG. 9 is a block diagram showing the construction of a timing control circuit in a fourth embodiment of the present invention.

A timing control circuit in a fourth embodiment of the present invention will be described hereinafter with reference to the drawings. FIG. 9 shows the construction of a timing control circuit in the fourth embodiment of the present invention, with eight (n=8) signal delay circuits being used as a signal delaying circuit 30. Assume that two types of delay values are provided as delay circuit element 10 for brief description. It is needless to say that a plurality (two types or more) of delay values may be provided as a delay circuit element 10.

A delay circuit element 10 has an invertor 12 and an invertor 14 connected in series, a drain of a first N channel MOS transistor 16 connected to the output of an invertor 12, a delay control signal 20 connected to the gate of a first N channel MOS transistor 16, a source of a first N channel MOS transistor 16 connected to the gate of a second N channel MOS transistor 18, and also, a drain and a source of the second N channel MOS transistor 18 both connected to a ground electric potential. A signal delay circuit 30 is connected in series with eight delay circuit elements 10, gives a clock signal 32 to the input of the invertor 12 within a first stage of delay circuit element 10, has the output of the invertor 14 within each delay circuit element 10 as first through eighth delay clock signals 34a through 34h, a selecting circuit 40 is composed of a 8 input 1 output select circuit to be controlled with eight selecting control signals 42a through 42h, and a buffer circuit 46. A bi-directional shift register circuit 50 is composed of a shift register using eight registers (flip-flop) 58a through 58h to be controlled with a reset signal 52, a shift direction control signal 54, a shift clock 56 so as to output a value the respective registers 58a through 58h retain as selecting control signals 42a through 42h. The delay control register 100 is composed of eight bits of registers 102a through 102h for writing/retaining/reading the delay control data under the control of a reset signal 52 and a delay control register writing signal 104. The phase detecting circuit 120 is a circuit having a function of detecting the phase difference of the clock signal 32 and the internal clock 48 so as to generate the phase difference signal 122 synchronized with the internal clock 48. The shift control circuit 124 is a circuit having a function of generating a shift direction control signal 54 and a shift clock 56 with the phase difference signal 122 being provided as a base so as to control the shift operation of the bi-directional shift register circuit 50.

A timing control circuit of the present embodiment is composed of a signal delay circuit 30, a selecting circuit 40, a bi-directional shift register circuit 50 and a delay control register 100. Eight bits of register output of the delay control register 100 are respectively made the eight delay control signals 20a through 20h of the signal delay circuit 30, the clock signal 32 and the delay clock signals 34a through 34h of the signal delay circuit 30 are inputted to a 8 input 1 output select circuit within the selecting circuit 40, the clock signal 32 and the internal clock signal 48 are inputted to the phase detecting circuit 120, the phase difference signal 122 is inputted to the shift control circuit 124, the shift direction control signal 54 and the shift clock 56 are inputted to the bi-directional shift register circuit 50 to provide eight selecting control signals 42a through 42h to be outputted from the bi-directional shift register circuit 50.

A timing control circuit in the present embodiment constructed as described hereinabove will be described hereinafter in its operation.

In the delay circuit element 10, a first N channel MOS transistor 16 becomes a switching circuit to turn on•off with a signal to be given to the delay selecting signal 20, a second N channel MOS transistor 18 becomes a capacitive load. When the delay selecting signal 20 becomes a "L" level, the first N channel MOS transistor 16 becomes off and the capacitive load composed of the second N channel MOS transistor 18 is separated, and the delay in the delay circuit element 10 becomes $\tau 0$ (=delay when the first N channel MOS transistor 16 is off). On the other hand, when the delay selecting signal 20 becomes the "H" level, the first N channel MOS transistor 16 becomes on, the capacitive load which is composed of a second N channel MOS transistor 18 is connected so as to make the delay in the delay circuit element 10 $\tau 1$ (=delay when the first N channel MOS transistor 16 is on), (here clearly $\tau 0 < \tau 1$). In the signal delay circuit 30, first through eighth delay control signals 20a through 20h controls to two-way values of $\tau 0$ and $\tau 1$ the delay in a m th ($1 \leq m \leq n = 8$, m is an integer) output (=either of the delay clock signals 34a through 34h) of the signal delay circuit 30 can be controlled by the combination of the signal level "L" or the "H". First through eighth delay control signals 20a through 20h are given by a value set within the delay control register 100. Thus, by the control of the value set within the delay control register 100, the delay of the individual delay circuit element 10 within the signal delay circuit 30 can be independently controlled.

A bi-directional shift register circuit 50 shifts the set bit with the us of the shift direction control signal 54 and a shift clock 56. The shift direction control signal 54 and the shift clock 56 are given by a shift control circuit 124 to be controlled by the phase detecting circuit 120 so as to change the condition where the phase difference has been detected between the clock signal 32 and the internal clock 48 in the phase detecting circuit 120. The shift direction control signal 54 is converted into the shift direction information of the phase advance/-delay. The shift clock 56 is a pulse synchronized with an internal clock 48 to be generated only when the phase difference has been caused. The set bit exists in the only of the resisters 58a through 58h within the bi-directional shift register circuit 50, and the others are all reset bits. The set bit certainly exists in the either the registers 58a through 58h within the bi-directional shift register circuit 50. When it has been shifted down to the end of the shift register, it is controlled not to be shifted further. Reset signals 52 are inputted to all the registers 58a through 58h, and are used to give the initial values to all the registers 58a through 58h. The initial value only of the register 58a is made "H", and the others all are made "L". The set bits are adapted to be set only in the least significant register 58a. The set bit and the rest bit become selecting control signals 42a through 42h of the 8 input 1 output select circuit within the selecting circuit 40, select one of the delay signals 34a through 34h within a signal delay circuit 30 corresponding to the set bit so as to control for outputting it as the internal clock 48. The delay clock signal corresponding to the reset bit is not selected. In this manner, the signal delayed by a desired delay is taken out from the signal delay circuit 30 so as to output it as the internal clock 48.

Figure 10:
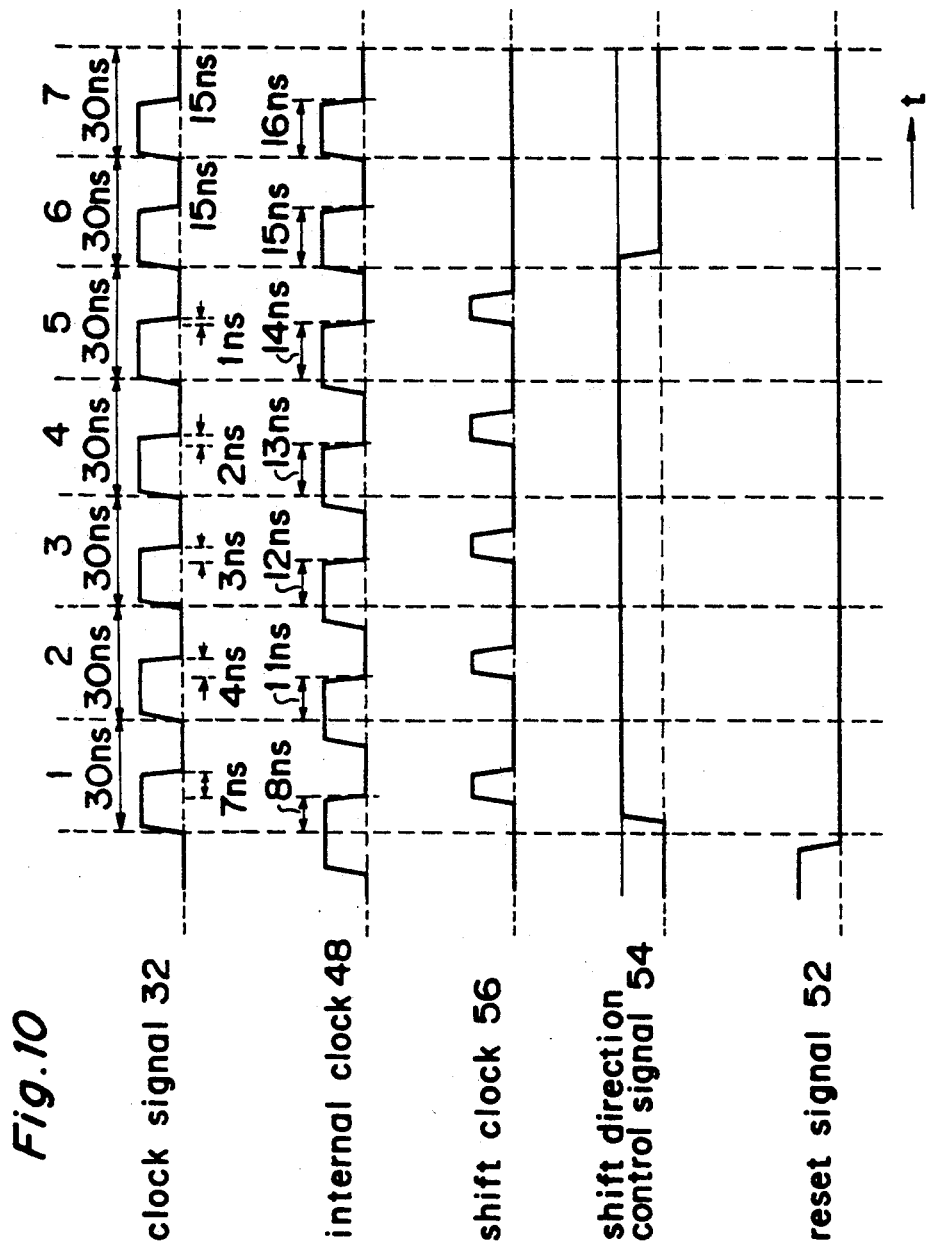
FIG. 10 shows timing charts showing the operation of a timing control circuit in the fourth embodiment of the present invention.
Figure 11:
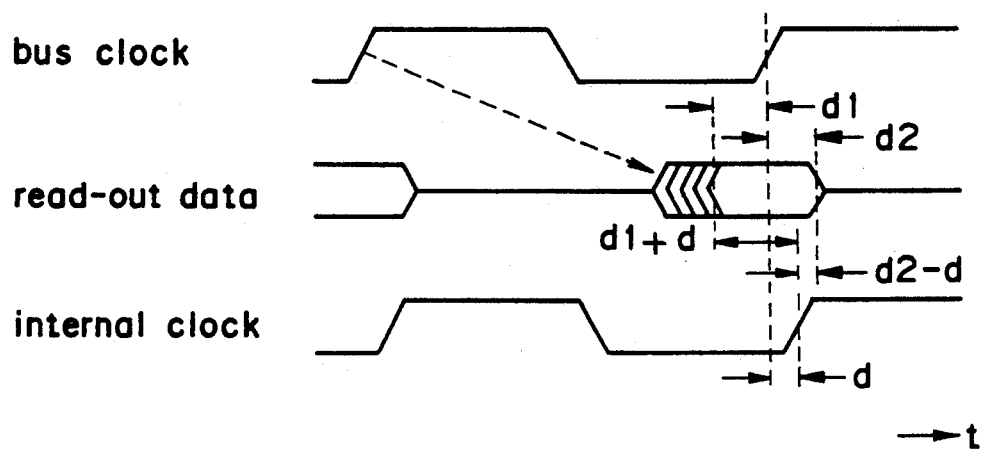
FIG. 11 shows timing charts for illustrating the necessity of a phase synchronous control.
Figure 11:
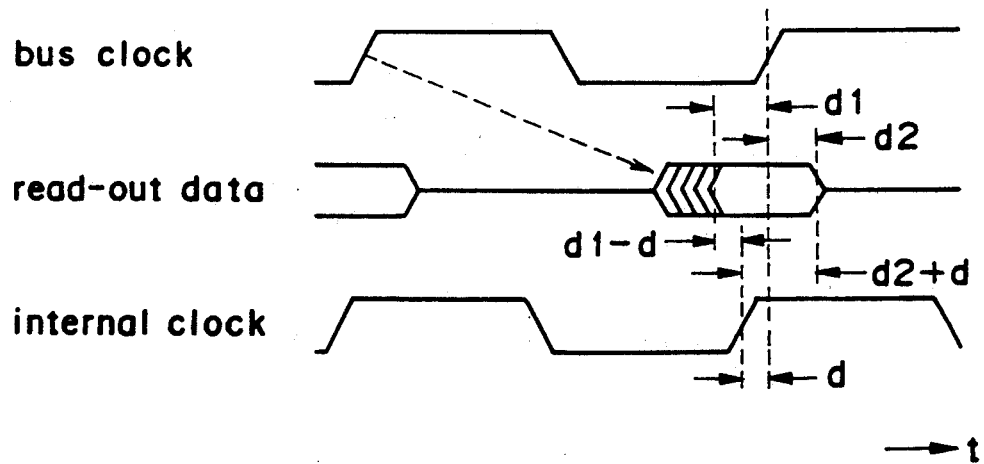
Figure 12:
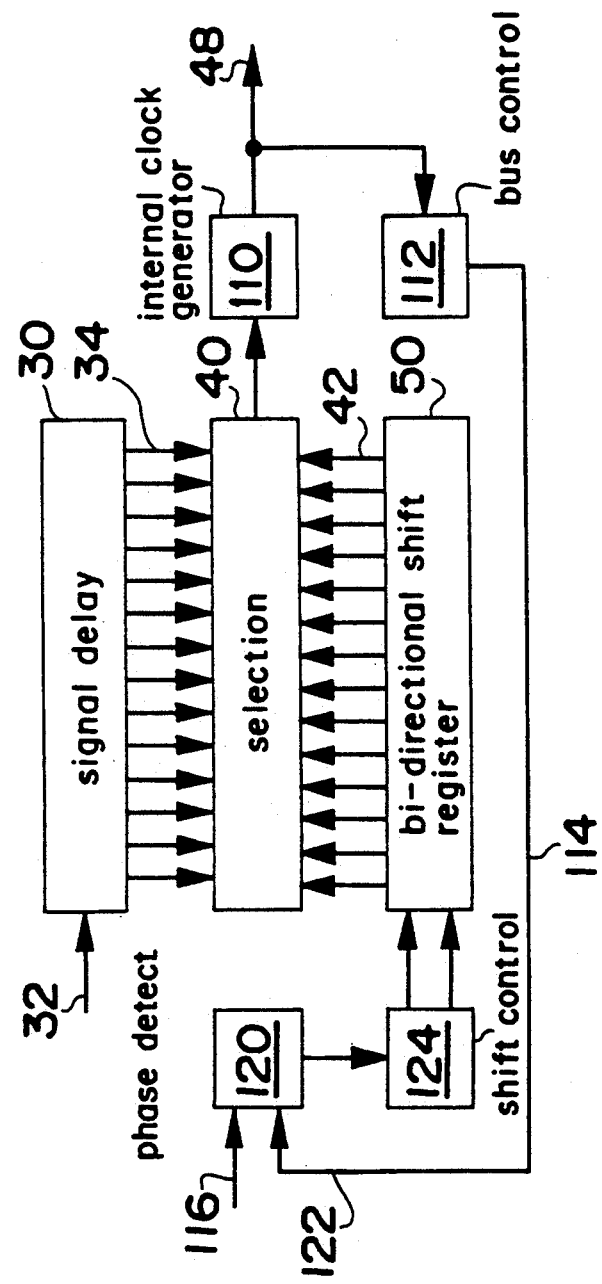
FIG. 12 is a block diagram showing the construction of the conventional timing control circuit.

The above described operation expressed in the timing charts will be described in FIG. 10. In FIG. 10, assume that the period of the clock signal 32 is 30 ns, the delay of the signal in the selecting circuit 40 is 5 ns (including the delay of the buffer circuit 46 due to the load of the internal clock 48), $\tau 0 = 1$ ns, $\tau 1 = 3$ ns. In the delay control register 100, assume that the "H" is set in the registers 102a, 102b, 102g, 102h, the "L" is set in the 102c through 102f. In the next cycle with the reset signal 52 being the "L", the delay clock signal 34a is selected. At this time point, the phase of the internal clock 48 advances by 7 ns ($= 15$ ns $- 5$ ns $- 3$ ns) with respect to the phase of the clock signal 32. The phase detecting circuit 120 detects the advance of the phase, gives instructions so that the set bit may be shifted to the bi-directional shift register circuit 50 through the shift control circuit 124. The delay clock signal 34b is selected in the next cycle (second cycle) with the instructions. The delay clock signals 34a, 34b are set to have delay $\tau 1$ large by the delay control register 100, the clock signal 32 delays the phase quickly down to near the phase synchronous point. Hereinafter, the operation is repeated and the delay clock signal 34f is selected at the sixth cycle so as to agree in phase. The delay clock signals 34c through 34f are set so that the difference between them may become $\tau 0$ ($= 1$ ns) respectively. Therefore, the delay may be controlled with minute time unit near the phase synchronous point.

According to the present embodiment, a switching circuit and a capacitive load connected with it are provided as a signal delay circuit 30. A delay circuit element 10, connected in series by plurality, which is capable of controlling the delay by the on•off controlling of the switching circuit, is used. The respective delay circuit element 10 for constituting the signal delay circuit 30 by the data retained in the delay control register 100 is controlled independently. The desired delay is selected by the combination between the selecting circuit 40 and the bi-directional shift register circuit 50. Wide range of delay can be controlled without increase in the number of the delay circuit element 10 within the signal delay circuit 30.

Assume that the signal delay circuit 30 is composed of eight stages (n=8) of delay circuit elements 10, the delay is 1 ns ($= \tau 0$) and 3 ns ($= \tau 1$). When the delay made necessary to lock the phase locked loop (PLL) is 8 through 10 ns, such data as the delay of first, second, seventh, eighth delay circuit element 10 may be set in $\tau 1$, as the delay of third through sixth delay circuit element 10 may be set in $\tau 0$ are set in the delay control register 100, the accuracy of the delay control near the lock point can be made $\tau 0$. And, fine controlling operation can be effected. When the lock point has been disengaged from, the $\tau 1$ is used as the delay of rough accuracy, so that the focusing to the lock point is effected at high speed. It is a point in the timing control circuit in the present embodiment that the delay of the respective delay circuit elements 10 in the signal delay circuit 30 can be set freely with the use of the delay control register 100.

The drain of the first N channel MOS transistor 16 connected with the output of the invertor 14, instead of the output of the invertor 12 may be used as the delay circuit element 10. The first and second MOS transistor 16 and 18 to be used in the delay circuit element 10, and the N channel MOS transistor 44 to be used in the selecting circuit 40 are not necessary to be restricted to the N channel MOS transistor, can be properly selected in accordance with designs through joint uses of the P channel MOS transistor, the N channel MOS transistor and the P channel MOS transistor. The second MOS transistor 18 is not necessary to be the transistor. It may be either if it becomes a capacitive load. For example, wiring through capacity between basic plates and diffusion layer through capacity between basic plates can be used. A delay circuit element composed of the series connection between an invertor capable of adjusting the driving performance with the control signal and the normal invertor may be used, as shown in FIG. 3, as the delay circuit element 10. Any circuit may be used if a circuit is capable of changing the delay value with the control signal. Also, though in this embodiment the circuit consisting of N channel MOS transistor is employed as the selection circuit 40, any kinds of circuits or elements can be employed so long as providing the same operation of the selection circuit 40. Instead of a buffer circuit 46, a clock generating circuit of having various functions of generating the polyphase clock from the simple clock can be used.

In the present embodiment, a case where two types of delay values are provided as the delay circuit element 10 is considered. When the delay value of i type is provided, the delay value of n bit x j word can be set by the use of the control data of n bit x j word (j is a minimum natural number filling $j \leq \log 2i$).

As mentioned above in detail, the first feature of the invention is provided by a circuit connecting in series a plurality of delay circuit elements having a plurality of delay values as a signal delay circuit, and can be done to control the range of phase control in the signal delay circuit by selecting the desired amount of delay upon detecting the phase control information of itself to feed back to the signal delay circuit in dynamic without giving the corresponding frequency range information from the outside in confirmation of the delay value control circuit employing the delay control signal, selecting circuit, bi-directional shift register circuit and delay control circuit.

According to the second feature of the invention, a switching circuit and a capacitive load connected with it are provided as a signal delay circuit. A delay circuit element capable of controlling the delay is used by the on•off controlling of the switching circuit. By the combination of a delay value control using the delay control signal, a selecting circuit, a bi-directional shift register circuit and a delay control circuit, the information of the phase control is dynamically feedback by the signal delay circuit so as to select the desired delay so that the range of the phase control in the signal delay circuit can be controlled. Especially, by the characteristics which are capable of wide range of delay control with the small circuit scale, it becomes optimum as the delay circuit of the phase locked loop (PLL).

According to the third feature of the invention, when the delay in a range which cannot be controlled in a delay control range of the signal delay circuit, the clock signal in one from among a plurality of delay lines having previously different in delay prior to inputting of the clock signal into the signal delay circuit. Thereafter, the delay is controlled with the signal delay circuit, the selecting circuit, the bi-directional shift register circuit so as to effect the timing control. The overflow detecting circuit judges whether or not the timing control may be effected within the delay control range of the signal delay circuit with the use of the information of a ninth selecting control signal of the bi-directional shift register circuit. When the delay is necessary, an instruction is given to the delay line selecting control circuit to control that the output of the signal delay line having larger delay by the delay line selecting circuit may be selected, thus realizing the wide range of timing control. By the use of a means of selecting the delay corresponding to the necessary delay before fine delay control is effected, it is delayed down to a range capable of controlling with the signal delay circuit so that the wide range of timing control can be realized. It may be made optimum as the delay circuit of the phase locked loop (PLL).

According to the fourth feature of the invention, there provides the signal delay circuit where two sets of delay circuit elements connecting a plurality of delay circuit elements in series are connected in series, and a mechanism capable for selecting either one of the outputs from the delay circuit elements within the two sets of delay circuits is provided, so that it can be realized to control in timing within the wide ranges of frequencies by changing the two sets of delay circuit to obtain the desired delay upon controlling the delay control signal in combination of the selecting circuit, bi-directional shift register circuit and, delay control circuit.

According to the fifth feature of the invention, a switching circuit and a capacitive load connected with it are provided as a signal delay circuit. A plurality of delay circuit elements capable of controlling the delay by the on•off control of the switching circuit, connected in series can be connected. The respective delay circuit elements for constituting a signal delay circuit by the data retained in the delay control register are controlled independently so as to select the desired delay by the combination of the selecting circuit and the bi-directional shift register circuit, it becomes possible to control the delay of the wide range without increasing the number of the delay circuit elements within the signal delay circuit. Especially when it is used as the delay circuit of the phase locked loop (PLL), some delay circuit elements on the input side of the clock signal and some delay circuit elements on the terminal side of the delay circuit element row are set large in delay, such data as to set small the delay of the delay circuit element between them are set in the delay control register and also, the delay necessary in the phase lock may be obtained near the middle of the delay circuit element row so that the accuracy of the delay control near the lock point. When it has been disengaged from the lock point, the focusing operation to the lock point can be effected with high speed as the delay at both ends of the delay circuit element row.

Although the present invention has been fully described by way of example with reference to the accompanying drawings, it is to be noted here that various changes and modifications will be apparent to those skilled in the art. Therefore, unless otherwise such changes and modifications depart from the scope of the present invention, they should be construed as included therein.

What is claimed is:

1. A timing control circuit comprising a delay circuit for having, connected in series by n number (n≧2, n is an integer), delay circuit elements having a plurality of delay values for delaying, outputting by a constant time the given signals, a selecting circuit for selecting one of the outputs of the respective delay circuit elements so as to output it, a phase control circuit for deciding the output of the delay circuit elements to be selected so that the signal given to the delay circuit may agree in phase with the output signal of the selecting circuit, a delay control circuit for controlling the delay value of the delay circuit element itself, the delay control circuit being changed the delay value of the above described delay circuit element so as to change the delay control range in the delay circuit when the phase control circuit has judged that the delay in the whole delay circuit is insufficient at the phase synchronization.

2. A timing control circuit described in accordance with the claim 1, wherein a n input 1 output selecting circuit for inputting each output of the delay circuit elements is used as a selecting circuit, a phase detecting circuit for comparing the delay line selecting circuit with the phase of the output signal of the selecting circuit, a shift control circuit for outputting the shift clock and the shift direction control signal with the phase difference information from the phase detecting circuit being provided as a basic, a bi-directional shift register circuit of n bit to shift in bi-direction the only set bit in accordance with the shift clock and the shift direction control signal are used as the phase control circuit, a RS latch with the output of the most significant bit within the bi-directional shift register circuit being made the set signal is used as the delay control circuit so as to change the delay value of the delay circuit element with the output signal of the RS latch so as to change the whole delay circuit, either output of the delay circuit elements is selected so that the phase difference between the signal to be given to the delay circuit by the set bit within the bi-directional shift register circuit and the signal a n input 1 output selecting circuit outputs may become minimum.

3. A timing control circuit in accordance with the claim 1, where a plurality of delay lines for delaying by the respective different fixed periods the given signal as common inputs, a delay line selecting circuit for selecting one output from the outputs of a plurality of delay lines, delay circuit elements having a constant delay value having the output signal of the delay line selecting circuit to be inputted being connected in n number connected in series are used as a delay circuit, a n input 1 output selecting circuit for inputting the outputs of the signal to be given to the delay line selecting circuit and delay circuit elements is used as a selecting circuit, a phase detecting circuit for comparing the signal to be given to the delay circuit with the phase of the output signal of the selecting circuit, a shift control circuit for outputting the shift clock and the shift direction control signal with the phase difference information from the phase detecting circuit being provided as a basis, a bi-directional shift register circuit of n bit for shifting in bi-direction the only set bit in accordance with the shift clock and shift direction control signal is used as a phase control circuit, an overflow detecting circuit for detecting the constant period stay in the most significant bit of the set bit within the bi-directional shift register circuit, a delay line selecting control circuit for switching the output of the delay line to be selected by the delay line selecting circuit within the delay circuit with the output signal of the overflow detecting circuit is used as a delay control circuit, the delay value of the whole delay circuit is changed to obtain the delay necessary for the phase synchronization, and the output of either of the delay circuit element is selected, so that the phase difference between the signal to be given to the delay circuit by the set bit within the bi-directional shift register circuit and the signal the (n+1) input 1 output selecting circuit outputs may be minimum.

4. A timing control circuit in accordance with claim 1, wherein the delay circuit includes a first delay circuit and a second delay circuit connected in series, each of the circuits consisting of n pieces connected in series of delay circuit elements for outputting given signals upon delaying at a constant time, and a two inputs and one output selecting circuit element for selecting either one of outputs to be obtained by the delay circuit elements of the mth within the first delay circuit ($1 \leq m \leq n$, m is an integer), the selecting circuit includes a n inputs and one output selecting circuit for inputting the respective outputs of the selecting circuit elements, the phase control circuit includes a phase control circuit for comparing the signal being applied to the delay circuit with the phase of the selecting circuit, a shift control circuit for outputting both of the shift clock and shift directional control signal on the basis of the phase difference information from the phase detecting circuit, and a bi-directional shift register circuit of n bits for shifting only on of set bit toward the bi-direction in accordance with the shift clock and shift directional control signal, and the delay control signal includes a RS latch for employing as a set signal the output of the upper-most bit to be disposed within the bi-directional shift register circuit, whereby the selecting circuits to be selected by the selecting circuit elements within the delay circuit can be changed by the output signals of the RS latch, and either one of outputs of the selecting circuit elements within the delay circuit can be selected so as to make minimum the signals to be inputted into the delay circuit by the set bit within the bi-directional shift register circuit and the phase difference of signals to be outputted by the n+1 inputs and 1 output selecting circuit.

5. A timing control circuit comprising a delay circuit for having, connected in series by n number ($n \geq 2$, n is an integer), delay circuit elements having a plurality of delay values for delaying, outputting by a constant time the given signals, a delay control register of n bit for selecting each specific delay value of the above described delay circuit elements, a n input 1 output selecting circuit with the clock signal to be inputted to the above described delay circuit and the respective outputs of the above described delay circuit elements being inputted, a bi-directional shift register circuit of n bit for shifting the only set bit in bi-direction, the selecting operation of the n input 1 output selecting circuit being controlled by the set bit within the above described bi-directional shift register circuit.

* * * * *